United States Patent
Park et al.

(10) Patent No.: US 7,538,618 B2
(45) Date of Patent: May 26, 2009

(54) WIDEBAND ACTIVE BALUN CIRCUIT BASED ON DIFFERENTIAL AMPLIFIER

(75) Inventors: Seong Su Park, Daejeon (KR); Byoung Gun Choi, Daegu (KR); Byung Hun Min, Jeollabukdo (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/999,421

(22) Filed: Dec. 4, 2007

(65) Prior Publication Data
US 2008/0122538 A1    May 29, 2008

(30) Foreign Application Priority Data

Dec. 5, 2006  (KR) ................ 10-2006-0122524
Jun. 4, 2007  (KR) ................ 10-2007-0054421

(51) Int. Cl.
    H03F 3/45    (2006.01)
(52) U.S. Cl. ............... 330/301; 330/253; 333/25
(58) Field of Classification Search ........ 330/253, 330/301; 333/25–26
    See application file for complete search history.

(56) References Cited

U.S. PATENT DOCUMENTS

| 5,068,621 A | * | 11/1991 | Hayward et al. | ........... 330/253 |
| 6,121,809 A | | 9/2000 | Ma et al. | |
| 2008/0224795 A1 | * | 9/2008 | Choi et al. | ........... 333/25 |

FOREIGN PATENT DOCUMENTS

| JP | 60-007211 | 1/1985 |
| JP | 2005-151460 | 6/2005 |
| JP | 2005-286511 | 10/2005 |
| KR | 1999-0020110 A | 3/1999 |
| KR | 102005016837 | 11/2005 |

OTHER PUBLICATIONS

"Low Power 8-GHz Ultra-Wideband Active Balun", T. Hsu, et al., 2006 IEEE , p. 365-368.
"A New 0.25um CMOS On-Chip Active Balun with Gain Controllability for 5GHz DCR", M. Rajashekharaiah, et al., 2005 IEEE, pp. 71-74.
"Carrier Cancelling RF for Multi-Mode SDR Terminal Applicable to CDMA-Cellular, WCDMA, andWiBro", B. Choi, et al., 2007 IEEE, pp. 243-246.

* cited by examiner

*Primary Examiner*—Robert Pascal
*Assistant Examiner*—Hieu P Nguyen
(74) *Attorney, Agent, or Firm*—Blakely, Sokoloff, Taylor & Zafman LLP

(57) ABSTRACT

Provided is a wideband active balun circuit based on a differential amplifier. The active balun circuit is configured to compensate for unbalance between two differential signals and can be applied to wideband systems, such as software defined radio (SDR) systems or ultra wideband (UWB) systems. Also, when signal unbalance is caused by changes in process conditions, such as temperature, errors in amplitude and phase between the two differential signals can be finely tuned by adjusting a voltage tuning terminal outside a chip, so that the active balun circuit can simply solve the unbalance between the two differential signals. Furthermore, input transistors that constitute a pair of differential amplifiers are provided in a cascode structure to prevent the occurrence of signal leakage and self-mixture.

7 Claims, 5 Drawing Sheets

WIDEBAND ACTIVE BALUN CIRCUIT BASED ON DIFFERENTIAL AMPLIFIER

CROSS-REFERENCE TO RELATED APPLICATION

This application claims priority to and the benefit of Korean Patent Application No. 2006-122524, filed Dec. 5, 2006, and No. 2007-54421, filed Jun. 4, 2007, the disclosure of which is incorporated herein by reference in its entirety.

BACKGROUND

1. Field of the Invention

The present invention relates to a wideband active balance-to-unbalance (balun) circuit based on a differential amplifier and, more specifically, to a wideband balun circuit used for a radio-frequency (RF) transceiving system, which converts a single-ended RF input signal into two complementary differential output signals.

This work was supported by the IT R&D program of Ministry of Information and Communication/Institute for Information Technology Advancement [2006-S-015-01, Development of Digital RF and ADC Chips for Multi-Mode SDR Terminal.]

2. Discussion of Related Art

A wireless transceiving system wirelessly transmits and receives information through air from a distance. In order to ensure the quality and reliability of the transmitted information, the wireless transceiver performs a modulation operation in which an RF local oscillation frequency carries a signal, and a demodulation operation in which the local oscillation frequency is removed from a received signal to reproduce an original signal.

A frequency converter, which performs the above-described important modulation and demodulation operations, is the essential component that determines the communication quality of the wireless transceiving system. FIG. 1 illustrates an RF front-end portion of a receiving system including a frequency converter.

Referring to FIG. 1, the RF front-end portion of the receiving system includes a low-noise amplifier (LNA) 110, which low-noise amplifies a received RF signal RF, an RF balun circuit 120, which outputs the amplified RF signal RF as a differential signal, a local oscillation signal generation circuit 130, which generates a local oscillation signal LO, a double balance mixer 140, which converts an RF signal into an intermediate frequency (IF) signal IF, and an IF output circuit 150, which amplifies the IF signal and outputs the amplified IF signal.

The balun circuit 120 is used to divide a single input signal into two phase-inverted output signals. In order to obtain phase-inverted complementary signals having the same amplitude, a balanced structure is typically used to convert a single-ended input signal into a complementary differential output signal.

The construction of a conventional active balun circuit 120 based on a differential amplifier will now be described with reference to FIG. 2.

Referring to FIG. 2, a first resistor R21 is connected between a power supply voltage terminal VDD and a first node Q21, and a second resistor R22 is connected between the power supply voltage terminal VDD and a second node Q22. Drain and source terminals of a first NMOS transistor N21 are connected between the first node Q21 and a third node Q23, and drain and source terminals of a second NMOS transistor N22 are connected between the second node Q22 and the third node Q23. A third NMOS transistor N23 having a gate terminal to which a predetermined bias voltage is applied by a bias terminal BIAS is connected between the third node Q23 and a ground terminal GND. A first capacitor C21 is connected between an input terminal VIN and a gate terminal of the first NMOS transistor N21. A third resistor R23 is connected between a bias terminal VB for applying a specific bias voltage and the gate terminal of the first NMOS transistor N21, and a fourth resistor R24 is connected between the bias terminal VB and a gate terminal of the second NMOS transistor N22. A second capacitor C22 is connected between the first node Q21 and a first output terminal VO1, and a third capacitor C23 is connected between the second node Q22 and a second output terminal VO2. A first inductor L21, a fifth capacitor C24, and a fifth resistor R25 are connected in series between the first node Q21 and the gate terminal of the second NMOS transistor N22.

In the above-described construction, one terminal of the active balun circuit 120 based on the differential amplifier is AC grounded, while a single-ended input signal is applied to the other terminal of the active balun circuit 120 to obtain differential output signals. In this case, the differential output signals become unbalanced due to a capacitive loading effect of a parasitic capacitor caused by the third NMOS transistor N23 functioning as a tail current source. In particular, when an RF signal is applied to the active balun circuit 120, unbalance between the two differential output signals becomes more serious.

In order to overcome this drawback, U.S. Patent Registration No. 6,121,809 entitled "Accurate and Tuneable Active Differential Phase Splitters in RFIC Wireless Applications" has been disclosed. In this disclosure, a feedback circuit is structured by a first inductor L21, a fifth capacitor C25, and a fifth resistor R25 and inserted between a first node Q21 and a gate node of a second NMOS transistor N22 to compensate for signal unbalance.

According to the above-mentioned U.S. Patent Registration No. 6,121,809, signals are balanced by feeding a low-amplitude input signal back to a node from which a high-amplitude signal is output. However, it is difficult to apply this technique to a wideband active balun circuit, and a chip area is increased due to a bulky inductor.

SUMMARY OF THE INVENTION

The present invention is directed to a wideband active balance-to-unbalance (balun) circuit, which can compensate for unbalance between two differential signals using CMOS devices that have increased integration density advantages.

Also, the present invention is directed to a wideband active balun circuit, which can compensate for unbalance between two differential signals by finely tuning errors in amplitude and phase between the two differential signals in a simple manner.

Furthermore, the present invention is directed to a wideband active balun circuit, which can prevent the occurrence of signal leakage and self-mixture due to interference between input and output nodes.

To achieve the above-described objects, the present invention provides a wideband active balance-to-unbalance (balun) circuit based on a differential amplifier, which converts a single-ended input signal into two phase-inverted differential signals having the same amplitude and outputs the two differential signals, wherein a dummy resistor and a dummy transistor are connected in series between a power supply voltage terminal and a drain terminal of a transistor used as a tail current source in order to compensate for unbalance between the two differential signals caused by a parasitic capacitance of the transistor used as the tail current source.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown.

Embodiment 1

The construction of an active balance-to-unbalance (balun) circuit 300 will now be described with reference to FIG. 3.

Figure 1:
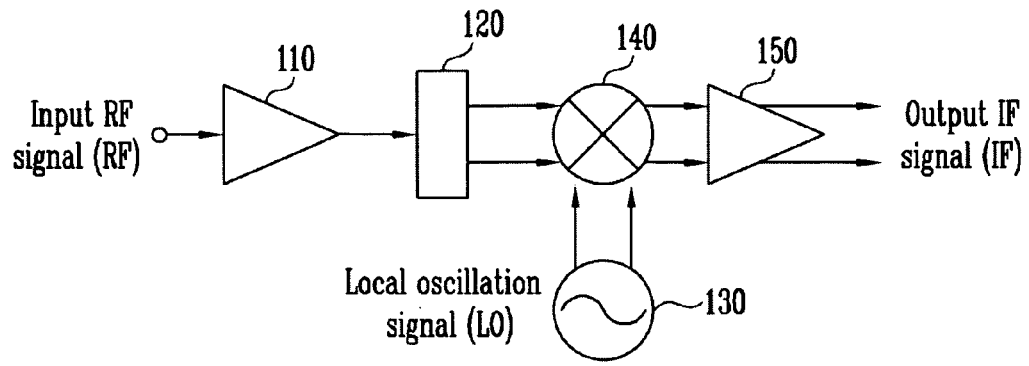
FIG. 1 is a diagram of a radio-frequency (RF) front-end portion of a receiving system including a frequency converter.
Figure 2:
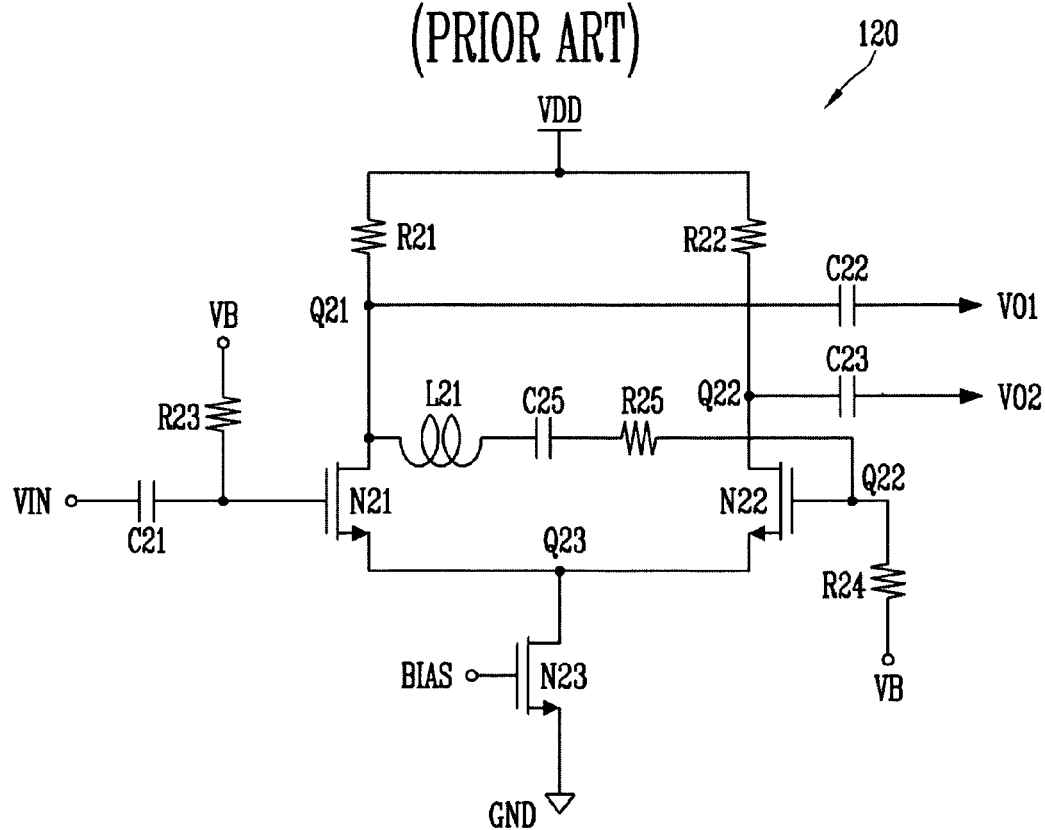
FIG. 2 is a circuit diagram of a conventional active balance-to-unbalance (balun) circuit based on a differential amplifier.
Figure 3:
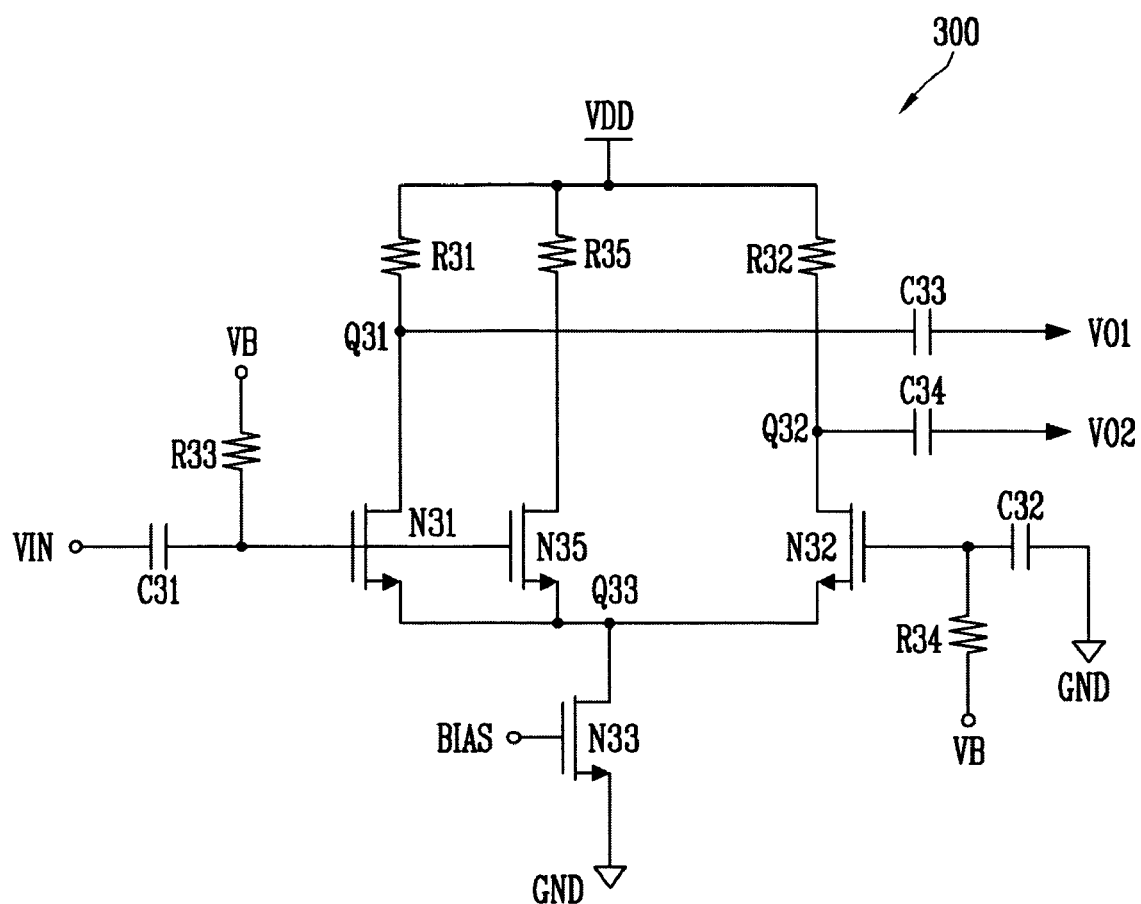
FIG. 3 is a circuit diagram of an active balun circuit according to an exemplary embodiment of the present invention.

Referring to FIG. 3, a first resistor R31 is connected between a power supply voltage terminal VDD and a first node Q31, and a second resistor R32 is connected between the power supply voltage terminal VDD and a second node Q32. Drain and source terminals of a first NMOS transistor N31 are connected between the first node Q31 and a third node Q33, and drain and source terminals of a second NMOS transistor N32 are connected between the second node Q32 and the third node Q33. A third NMOS transistor N33 having a gate terminal to which a predetermined bias voltage is applied by a bias terminal BIAS is connected between the third node Q33 and a ground terminal GND. A first capacitor C31 is connected between an input terminal VIN and a gate terminal of the first NMOS transistor N31, and a second capacitor C32 is connected between the ground terminal GND and a gate terminal of the second NMOS transistor N32. A third resistor R33 is connected between a bias terminal VB for applying a specific bias voltage and the gate terminal of the first NMOS transistor N31, and a fourth resistor R34 is connected between the bias terminal VB and the gate terminal of the second NMOS transistor N32. A third capacitor C33 is connected between the first node Q31 and a first output terminal VO1, and a fourth capacitor C34 is connected between the second node Q32 and a second output terminal VO2. A fifth resistor R35 and a fifth NMOS transistor N35 are connected in series between the power supply voltage terminal VDD and the third node Q33, and a gate terminal of the fifth NMOS transistor N35 is connected to the gate terminal of the first NMOS transistor N31. Here, the fifth resistor R35 and the fifth NMOS transistor N35 may be interpreted as a dummy resistor and a dummy transistor, respectively.

The above-described active balun circuit 300 according to the current embodiment of the present invention is configured such that unbalance between two differential signals is compensated for by inserting the fifth resistor R35 and the fifth NMOS transistor N35 as dummy components between the power supply voltage terminal VDD and the third node Q33, as will be described in more detail.

In order to find a major cause for unbalance between two differential signals, a ratio of a first differential signal $V_{O1}$ to a second differential signal $V_{O2}$ in the case of a conventional active balun circuit to which a compensation circuit is not inserted can be obtained using small-signal modeling as shown in Equation 1:

$$\frac{V_{O1}}{V_{O2}} = -\frac{g_m^2 + sC_{gs}g_m - s^2C_{gd}(C_{ss} + 2C_{gs}) - sg_m(2C_{gd} - C_{ss})}{g_m^2 + sC_{gs}g_m} \quad \text{[Equation 1]}$$

wherein $C_{ss}$ denotes a parasitic capacitance caused by a capacitive loading effect of the third NMOS transistor N33, $g_m$ denotes the transmission conductance of each of the first and second NMOS transistors N31 and N32 that constitute a pair of differential amplifiers, $C_{gs}$ denotes a parasitic capacitance between the gate and source terminals of each of the first and second NMOS transistors N31 and N32, and $C_{gd}$ denotes a parasitic capacitance between the gate and drain terminals of each of the first and second NMOS transistors N31 and N32.

As can be seen from Equation 1, the third and fourth terms of a numerator cause unbalance between the first differential signal $V_{O1}$ to the second differential signal $V_{O2}$. Thus, it can be seen that the parasitic capacitance $C_{ss}$ caused by the capacitive loading effect of the third NMOS transistor N31 used as a tail current source and the parasitic capacitance $C_{gd}$ between the gate and drain terminals of each of the first and second NMOS transistors N31 and N32 are the major causes for the unbalanced differential signals $V_{O1}$ and $V_{O2}$.

By comparison, a ratio of a first differential signal $V_{O1}$ to a second differential signal $V_{O2}$ in the case of the active balun circuit 30 in which the fifth resistor R35 and the fifth NMOS transistor N35 are inserted as dummy components according to the present invention can be obtained as shown in Equation 2:

$$\frac{V_{O1}}{V_{O2}} \approx -\frac{g_m(C_{ss} + C_{gs} - 2C_{gd})s + g_m^2 + \omega^2 C_{gd}(C_{ss} + 2C_{gs} + C_{gs1})}{g_m(C_{gs} + C_{gs1})s + g_m^2 + g_m g_{m1}} \quad \text{[Equation 2]}$$

wherein $C_{gs1}$ denotes a parasitic capacitance between the gate and source terminals of the fifth NMOS transistor N35 inserted as the dummy transistor, and $g_{m1}$ denotes the transmission conductance of the fifth NMOS transistor N35.

As can be seen from Equation 2, the real and imaginary numbers of the two differential signals $V_{O1}$ and $V_{O2}$ can be equalized by adjusting the parasitic capacitance $C_{gs1}$ between the gate and source terminals of the fifth NMOS transistor N35 and the transmission conductance $g_{m1}$ of the fifth NMOS transistor N35.

In Equation 2, the parasitic capacitance $C_{gs1}$ between the gate and source terminals of the fifth NMOS transistor N35 and the transmission conductance $g_{m1}$ of the fifth NMOS transistor N35, which are used to balance the two differential signals $V_{O1}$ and $V_{O2}$, can be obtained as shown in Equations 3 and 4:

$$C_{gs1} = C_{ss} - 2C_{gd} \quad \text{[Equation 3]}$$

$$g_{m1} = 2\omega^2 C_{gd}(C_{gs} + C_{ss} - C_{gd})/g_m \quad \text{[Equation 4]}$$

wherein $C_{gs1}$ denotes the parasitic capacitance between the gate and source terminals of the fifth NMOS transistor N35, $C_{ss}$ denotes a parasitic capacitance caused by a capacitive loading effect of the third NMOS transistor N33, $C_{gd}$ denotes a parasitic capacitance between the gate and drain terminals of each of the first and second NMOS transistors N31 and N32, $g_{m1}$ denotes the transmission conductance of the fifth NMOS transistor N35, $C_{gs}$ denotes a parasitic capacitance between the gate and source terminals of each of the first and second NMOS transistors N31 and N32, and $g_m$ denotes the transmission conductance of each of the first and second NMOS transistors N31 and N32 that constitute a pair of differential amplifiers.

That is, according to the present invention, the fifth NMOS transistor N35 is inserted in the active balun circuit 300 so that unbalanced differential signals can be compensated for by adjusting the parasitic capacitance $C_{gs1}$ between the gate and source terminals of the fifth NMOS transistor N35 and the transmission conductance $g_{m1}$ of the fifth NMOS transistor N35.

However, when the active balun circuit 300 according to the present invention is embodied as an integrated circuit (IC), the parasitic capacitance $C_{gs1}$ between the gate and source terminals of the fifth NMOS transistor N35 and the transmission conductance $g_{m1}$ of the fifth NMOS transistor N35 may depart from desired target values due to changes in process conditions, such as temperature, so that problems, such as signal unbalance, signal leakage, and self-mixture, may occur.

Therefore, according to the present invention, the transmission conductance of the fifth NMOS transistor N35 is finely tuned outside a chip to solve the signal unbalance, and a cascode transistor is further stacked on the first and second NMOS transistors N31 and N32, which constitute a pair of differential amplifiers, to prevent the occurrence of the signal leakage and self-mixture. These solutions to the problems will now be described in more detail in the following embodiments.

Embodiment 2

The construction of an active balun circuit 400 will now be described with reference to FIG. 4.

Figure 4:
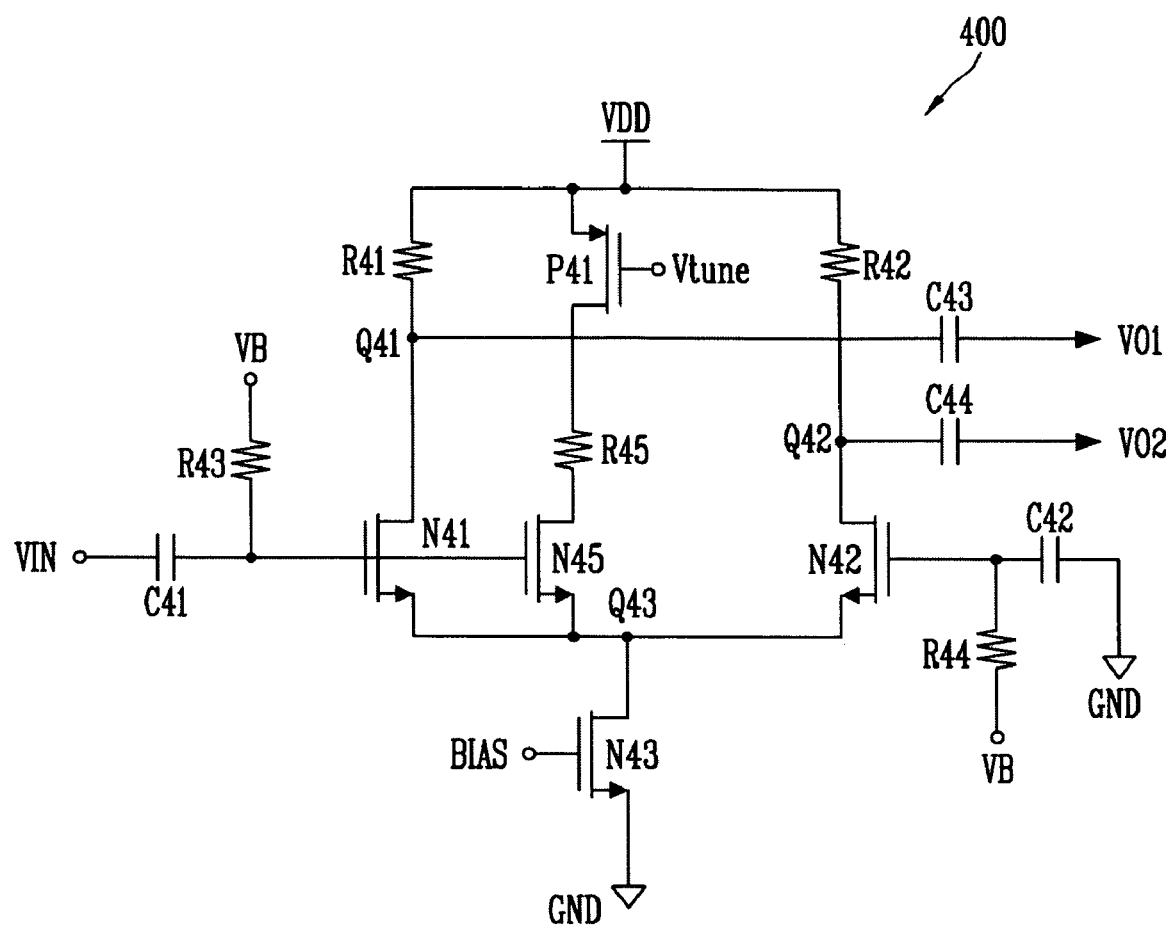
FIG. 4 is a circuit diagram of an active balun circuit according to another exemplary embodiment of the present invention.

Referring to FIG. 4, a first resistor R1 is connected between a power supply voltage terminal VDD and a first node Q41, and a second resistor R2 is connected between the power supply voltage terminal VDD and a second node Q42. Drain and source terminals of a first NMOS transistor N41 are connected between the first node Q41 and a third node Q43. Drain and source terminals of a second NMOS transistor N42 are connected between the second node Q42 and the third node Q43. A third NMOS transistor N43 having a gate terminal to which a predetermined bias voltage is applied by a bias terminal BIAS is connected between the third node Q43 and a ground terminal GND. A first capacitor C41 is connected between an input terminal VIN and a gate terminal of the first NMOS transistor N41, and a second capacitor C42 is connected between the ground terminal GND and a gate terminal of the second NMOS transistor N42. A third resistor R43 is connected between a bias terminal VB for applying a specific bias voltage and the gate terminal of the first NMOS transistor N41, and a fourth resistor R44 is connected between the bias terminal VB and the gate terminal of the second NMOS transistor N42. A third capacitor C43 is connected between the first node Q41 and a first output terminal VO1, and a fourth capacitor C44 is connected between the second node Q42 and a second output terminal VO2. A first PMOS transistor P41, a fifth resistor R45, and a fifth NMOS transistor N45 are connected in series between the power supply voltage terminal VDD and the third node Q43. A gate terminal of the first PMOS transistor P41 is connected to an external power supply voltage tuning terminal Vtune to finely tune a bias voltage outside a chip. A gate terminal of the fifth NMOS transistor N45 is connected to the gate terminal of the first NMOS transistor N41.

The first PMOS transistor P41 operates in a linear region, and the active balun circuit 400 is designed such that the bias voltage is changed using the external power supply voltage tuning terminal Vtune to vary the drain-source conductance of the first PMOS transistor P41.

Specifically, the drain-source conductance of the first PMOS transistor P41 is tuned using the external power supply voltage tuning terminal Vtune and added to a resistance of the fifth resistor R45. Thus, a current supplied to the fifth NMOS transistor N45 is adjusted, thereby finely tuning the transmission conductance of the fifth NMOS transistor N45.

Therefore, when signal unbalance is caused by changes in process conditions, such as temperature, the external power supply voltage tuning terminal Vtune is adjusted outside the chip so that errors in amplitude and phase between two differential signals can be finely tuned. As a result, the signal unbalance can be solved.

Embodiment 3

The construction of an active balun circuit 500 will now be described with reference to FIG. 5. The active balun circuit 500 can compensate for unbalance between two differential signals and prevent signal leakage and self-mixture caused by interference between input and output nodes.

Figure 5:
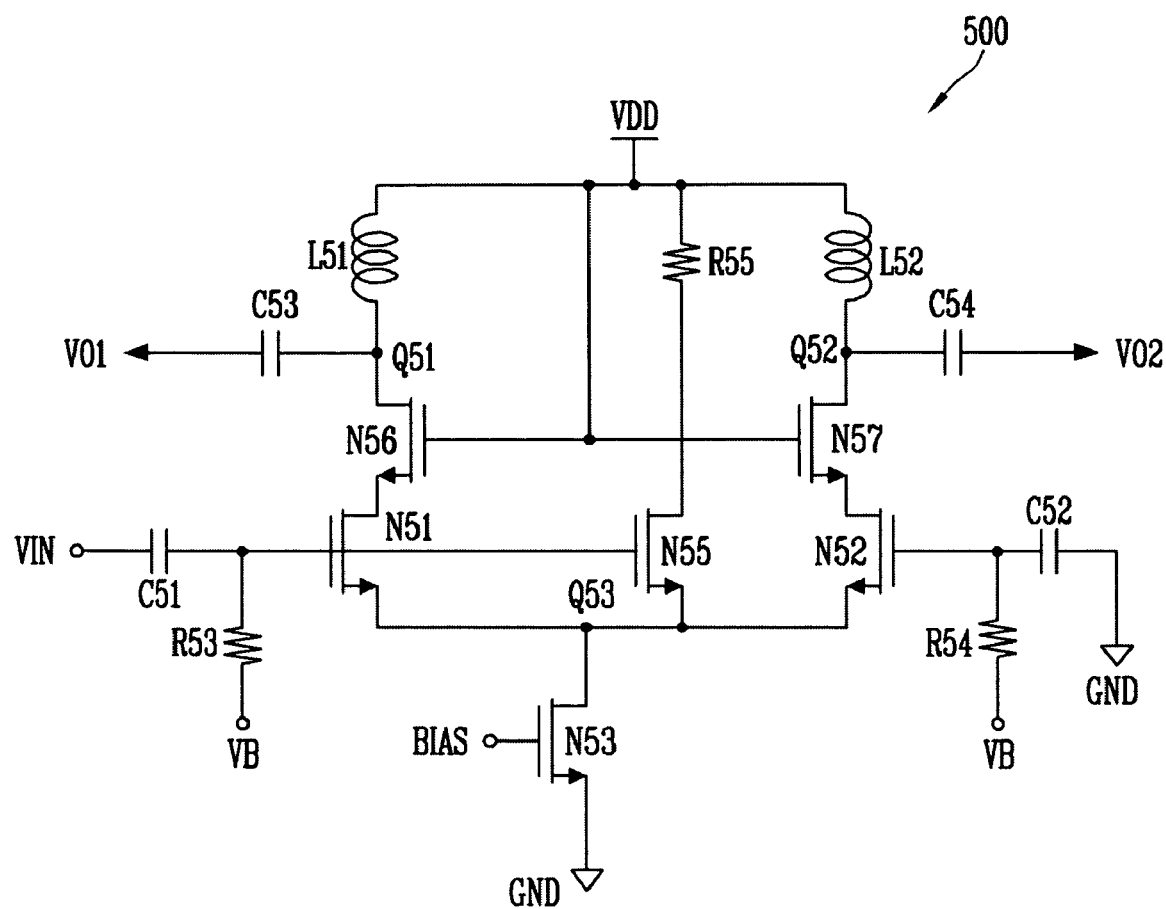
FIG. 5 is a circuit diagram of an active balun circuit according to yet another exemplary embodiment of the present invention.

Referring to FIG. 5, a first inductor L51 is connected between a power supply voltage terminal VDD and a first node Q51, and a second inductor L52 is connected between the power supply voltage terminal VDD and a second node Q52. A sixth NMOS transistor N56 and a first NMOS transistor N51, which are cascode transistors, are connected in series between the first node Q51 and a third node Q53. A seventh NMOS transistor N57 and a second NMOS transistor N52, which are cascode transistors, are connected in series between the second node Q52 and the third node Q53. A third NMOS transistor N53 having a gate terminal to which a predetermined bias voltage is applied by a bias terminal BIAS is connected between the third node Q53 and a ground terminal GND. A source terminal of the sixth NMOS transistor N56 is connected to a drain terminal of the first NMOS transistor N51, and a source terminal of the seventh NMOS transistor N57 is connected to a drain terminal of the second NMOS transistor N52. Also, gate terminals of the sixth and seventh NMOS transistors N56 and N57 are connected in common to the power supply voltage terminal VDD. A first capacitor C51 is connected between an input terminal VIN and a gate terminal of the first NMOS transistor N51, and a second capacitor C52 is connected between the ground terminal GND and a gate terminal of the second NMOS transistor N52. A third resistor R53 is connected between a bias voltage VB for applying a specific bias voltage and the gate terminal of the first NMOS transistor N51, and a fourth resistor R54 is connected between the bias voltage VB and the gate terminal of the second NMOS transistor N52. A third capacitor C53 is connected between the first node Q51 and a first output terminal VO1, and a fourth capacitor C54 is connected between the second node Q52 and a second output terminal VO2. A fifth resistor R55 and a fifth transistor N55 are connected in series between the power supply voltage terminal VDD and the third node Q53, and a gate terminal of the fifth NMOS transistor N55 is connected to the gate terminal of the first NMOS transistor N51.

In the above-described active balun circuit according to the current embodiment of the present invention, the fifth resistor R55 and the fifth NMOS transistor N55 are inserted as dummy components between the power supply voltage terminal VDD and the third node Q53 to compensate for signal unbalance. Furthermore, the sixth and seventh NMOS transistors N56 and N57, which are both the cascode transistors, are connected in series to the first and second NMOS transistors N51 and N52, respectively, to prevent signal leakage and self-mixture.

Figure 6:
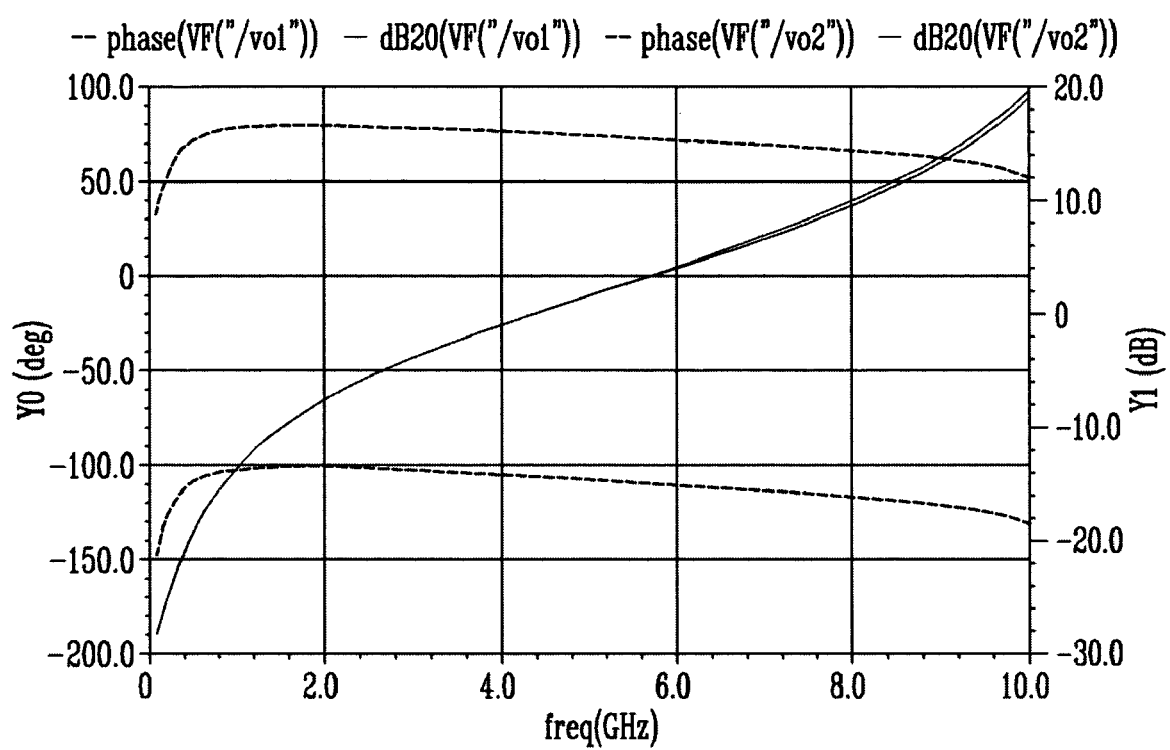
FIG. 6 is a graph showing computer simulation results of the active balun circuit shown in FIG. 5.

FIG. 6 is a graph showing computer simulation results of the active balun circuit 500 shown in FIG. 5.

Referring to FIG. 6, errors in amplitude and phase between differential output signals were 1 dB or less and 1° or less, respectively, in the range of 0 to 10 GHz. Therefore, it can be seen that the active balun circuit 500 according to the present invention exhibits excellent characteristics.

As described above, an active balun circuit according to the present invention can compensate for unbalance between two differential signals using a dummy transistor. Also, errors in amplitude and phase between the two differential signals can be finely tuned in a simple manner by adjusting a voltage tuning terminal outside a chip. Furthermore, input transistors that constitute a pair of differential amplifiers are provided in cascode structures, thereby preventing the occurrence of signal leakage and self-mixture.

As explained thus far, since an active balun circuit according to the present invention can compensate for unbalance between two differential signals using a dummy transistor, so that the active balun transistor can be applied to wideband systems, such as software defined radio (SDR) systems or ultra wideband (UWB) systems.

Also, when signal unbalance is caused by changes in process conditions, such as temperature, errors in amplitude and phase between the two differential signals can be finely tuned by adjusting a voltage tuning terminal outside a chip. Thus, the active balun circuit according to the present invention can simply solve the unbalance between the two differential signals.

Furthermore, input transistors that constitute a pair of differential amplifiers are provided in cascode structures so that the active balun circuit according to the present invention can prevent the occurrence of signal leakage and self-mixture.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A wideband active balance-to-unbalance (balun) circuit based on a differential amplifier, which converts a single-ended input signal into two phase-inverted differential signals having the same amplitude and outputs the two differential signals,
wherein a dummy resistor and a dummy transistor are connected in series between a power supply voltage terminal and a drain terminal of a transistor used as a tail current source in order to compensate for unbalance between the two differential signals caused by a parasitic capacitance of the transistor used as the tail current source.

2. The circuit according to claim 1, wherein the unbalance between the two differential signals is compensated for by tuning a parasitic capacitance between gate and source terminals of the dummy transistor and a transmission conductance of the dummy transistor.

3. The circuit according to claim 1, further comprising a first PMOS transistor for finely tuning errors in amplitude and phase between the two differential signals,
wherein a gate terminal of the first PMOS transistor is connected to an external power supply voltage tuning terminal, and a drain terminal of the first PMOS transistor is connected to a drain terminal of the dummy transistor through the dummy resistor.

4. The circuit according to claim 3, wherein a transmission conductance of the dummy transistor is finely tuned by changing a bias voltage of the first PMOS transistor using a power supply voltage applied from the external power supply voltage tuning terminal.

5. The circuit according to claim 1, further comprising sixth and seventh transistors for preventing signal leakage and self-mixture caused by interference between input and output nodes,
wherein the sixth and seventh transistors are serially connected in a cascode structure to first and second transistors that constitute a pair of differential amplifiers.

6. The circuit according to claim 5, wherein a source terminal of the sixth transistor is connected to a drain terminal of the first transistor, a source terminal of the seventh transistor is connected to a drain terminal of the second transistor, and gate terminals of the sixth and seventh transistors are connected to the power supply voltage terminal.

7. The circuit according to claims 1, wherein the transistor used as the tail current source, the dummy transistor, the first and second transistors, and the sixth and seventh transistors are NMOS transistors.

* * * * *